(12) United States Patent
Ueki et al.

(10) Patent No.: US 8,538,711 B2
(45) Date of Patent: Sep. 17, 2013

(54) NONAQUEOUS ELECTROLYTE TYPE LITHIUM ION SECONDARY BATTERY SYSTEM, METHOD OF DETERMINING LITHIUM DEPOSITION IN THE SYSTEM, AND VEHICLE MOUNTING THE SYSTEM

(75) Inventors: Tomoyoshi Ueki, Toyota (JP); Mariko Sumi, Toyota (JP); Masaya Takahashi, Kariya (JP); Hiroe Takenaka, Okazaki (JP); Mika Okubo, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 13/055,738

(22) PCT Filed: Oct. 1, 2009

(86) PCT No.: PCT/JP2009/067160
§ 371 (c)(1),
(2), (4) Date: Jan. 25, 2011

(87) PCT Pub. No.: WO2011/039882
PCT Pub. Date: Apr. 7, 2011

(65) Prior Publication Data
US 2012/0179398 A1 Jul. 12, 2012

(51) Int. Cl.
*G01R 31/36* (2006.01)
(52) U.S. Cl.
USPC .......................................................... 702/63
(58) Field of Classification Search
USPC .......................................................... 702/63
See application file for complete search history.

(56) References Cited

U.S. PATENT DOCUMENTS

| 5,994,877 A | 11/1999 | Seri et al. |
| 2007/0166617 A1* | 7/2007 | Gozdz et al. ............. 429/231.95 |
| 2011/0293975 A1* | 12/2011 | Iyori et al. ...................... 429/90 |

FOREIGN PATENT DOCUMENTS

| CN | 1203368 | 12/1998 |
| JP | 6-290815 | 10/1994 |
| JP | 9-17453 | 1/1997 |
| JP | 2005-39875 | 2/2005 |
| JP | 2008-16229 | 1/2008 |
| JP | 2008-181866 | 8/2008 |
| WO | WO 2008/078552 A1 | 7/2008 |

* cited by examiner

*Primary Examiner* — Marc Armand
*Assistant Examiner* — Ivan Rabovianski
(74) *Attorney, Agent, or Firm* — Finnegan, Henderson, Farabow, Garrett & Dunner, LLP

(57) ABSTRACT

It is arranged to obtain charging voltage when charging voltage is applied to a nonaqueous electrolyte type lithium ion secondary battery and discharging voltage when a discharging current is generated by the battery. A coefficient of a quadratic term of an approximated curve of a quadratic function with respect to changes in value within a sampling period for each of the charging voltage and the discharging voltage is calculated. This calculation is repeated over a plurality of the sampling periods. Based on occurrence situations of symmetry phenomenon and intersection phenomenon in the calculated coefficients, it can be determined whether or not there is a possibility of lithium deposition without disassembling the battery.

15 Claims, 12 Drawing Sheets

NONAQUEOUS ELECTROLYTE TYPE LITHIUM ION SECONDARY BATTERY SYSTEM, METHOD OF DETERMINING LITHIUM DEPOSITION IN THE SYSTEM, AND VEHICLE MOUNTING THE SYSTEM

CROSS-REFERENCE TO RELATED APPLICATIONS

This is a national phase application filed under 35 U.S.C. 371 of International Application No. PCT/JP2009/067160 filed on Oct. 1, 2009, the entire contents of which are incorporated herein by reference.

TECHNICAL FIELD

The present invention relates to a nonaqueous electrolyte type lithium ion secondary battery system arranged to determine whether or not there is a possibility of lithium deposition in a nonaqueous electrolyte type lithium ion secondary battery, a method of determining lithium deposition in the system, and a vehicle mounting the system. More particularly, the present invention relates to a nonaqueous electrolyte type lithium ion secondary battery system and others for determining lithium deposition based on data obtained by voltage measurement without disassembling a target battery.

BACKGROUND ART

In a nonaqueous electrolyte type lithium ion secondary battery for vehicle use and others, deposition of metallic lithium (hereinafter, referred to as "lithium deposition") may occur in the battery during use. Under such circumstances that lithium deposition has occurred, the target battery has been significantly deteriorating. If such battery is kept using as it has been used, the system cannot exhibit its intended performance. Accordingly, it is necessary ascertain the occurrence situation of lithium deposition in the nonaqueous electrolyte type lithium ion secondary battery.

A most reliable method of confirming whether or not lithium deposition has occurred is achieved by disassembling a battery and checking its internal state. However, setting aside a development stage, such actually used battery is hard to disassemble. This is because disassembling is troublesome and further, even if no lithium deposition is found by the check, reuse of the battery is difficult.

Therefore a technique of preventing the occurrence of lithium deposition is proposed in Patent Literature 1. Patent Literature 1 discloses that lithium deposition comes about in a very low temperature state. Accordingly, the battery is made to internally generate heat to raise the temperature before the battery comes into that low temperature state. If it is predicted that the battery is likely to come into that state, a charging degree of the battery is raised in advance.

CITATION LIST

Patent Literature

Patent Literature 1: JP 2008-16229A

SUMMARY OF INVENTION

Technical Problem

However, the technique in the above Patent Literature 1 does not confirm whether or not lithium deposition has actually occurred. On the other hand, that is not to say that lithium deposition does not absolutely occur unless in the very low temperature state. If lithium deposition occurs even though a battery does not come into that state, the technique in Patent Literature 1 could not treat such battery.

The present invention has been made to solve the above problems of conventional arts and has a purpose to provide a nonaqueous electrolyte type lithium ion secondary battery system capable of determining whether or not there is a possibility that lithium deposition has actually been occurring, without disassembling a battery, a method of determining lithium deposition in the system, and a vehicle mounting the system.

Solution to Problem

To achieve the above purpose, one aspect of the invention provides a nonaqueous electrolyte type lithium ion secondary battery system comprising: a voltage obtaining part for obtaining charging voltage when a charging current is applied to a nonaqueous electrolyte type lithium ion secondary battery and obtaining discharging voltage when a discharging current is generated by the nonaqueous electrolyte type lithium ion secondary battery; a coefficient calculating part for calculating a coefficient of a quadratic term of an approximated curve of a quadratic function with respect to changes in value within a previously set sampling period for each of the charging voltage and the discharging voltage obtained by the voltage obtaining part, and repeating the calculation over a plurality of the sampling periods; and a deposition determining part for determining whether or not there is a possibility of lithium deposition in the nonaqueous electrolyte type lithium ion secondary battery based on a tendency of changing with time of the coefficients of charging voltage and discharging voltage calculated by the coefficient calculating part.

The above lithium deposition determining method includes obtaining charging voltage when a charging current is applied to the nonaqueous electrolyte type lithium ion secondary battery and obtaining discharging voltage when a discharging current is generated by the nonaqueous electrolyte type lithium ion secondary battery, calculating a coefficient of a quadratic term of an approximated curve of a quadratic function with respect to changes in value within a previously set sampling period for each of the obtained charging voltage and discharging voltage, repeating this calculation over a plurality of sampling periods to determine whether or not there is a possibility of lithium deposition in the nonaqueous electrolyte type lithium ion secondary battery based on a tendency of changing with time of the calculated coefficients on the charging side and discharging side.

In the present aspect, firstly, the voltage obtaining part obtains charging voltage and discharging voltage of a battery. The coefficient calculating part then calculates a coefficient of a quadratic term of an approximated curve of a quadratic function with respect to the changes in value within the sampling period for each of the obtained charging voltage and the discharging voltage. This calculation is repeated over a plurality of sampling periods. The deposition determining part determines whether or not there is a possibility of lithium deposition in the nonaqueous electrolyte type lithium ion secondary battery based on the tendency of coefficient changes with time. This makes it possible to determine whether or not the lithium deposition has occurred, without disassembling the target battery.

The deposition determining part in this aspect can determine that: there is no possibility of lithium deposition when the occurrence frequency of symmetry phenomenon in which an increasing and decreasing tendency of a newly calculated coefficient with respect to a previously calculated coefficient is reversed between a charging side and a discharging side is less than a previously set threshold frequency, and there is a possibility of lithium deposition when the occurrence frequency of symmetry phenomenon is as high as the threshold frequency or more.

This is because a tendency has been found that the symmetry phenomenon is less likely to occur unless lithium deposition occurs and is likely to occur when lithium deposition has occurred.

It is further preferable that the deposition determining part in this aspect determines, even when the occurrence frequency of symmetry phenomenon is as high as the threshold frequency or more, that: there is no lithium deposition when no intersection phenomenon has occurred in which a magnitude relation of the coefficient of charging voltage and the coefficient of discharging voltage is reversed and there is no decrease with a differential larger than a previously set threshold differential after the occurrence frequency of symmetry phenomenon is determined to be as high as the threshold frequency or more, and there is a possibility of lithium deposition when the intersection phenomenon has occurred or the occurrence frequency of symmetry phenomenon decreases with the differential larger than the threshold differential.

This is because a tendency has been found that the intersection phenomenon is less likely to occur unless lithium deposition occurs and is apt to occur when lithium deposition occurs. Further, a tendency has been found that when lithium deposition has occurred, the occurrence frequency of the symmetry phenomenon may decrease even after it increases once.

It is preferable that the deposition determining part in this aspect determines, even when the intersection phenomenon has occurred or the occurrence frequency of symmetry phenomenon decreases with the differential larger than the threshold differential, that: there is no possibility of lithium deposition when a ratio of positive coefficients in the coefficients of charging voltage and discharging voltage calculated by the coefficient calculating part is as high as a previously threshold ratio or higher, and there is a possibility of lithium deposition when the ratio is less than the threshold ratio.

This is because a tendency has been found that almost all coefficients are positive unless lithium deposition occurs and the number of negative coefficients increases when lithium deposition occurs.

It is preferable that the deposition determining part in this aspect determines, even when the ratio is less than the threshold ratio, that there is no possibility of lithium deposition when an increasing rate of resistance of the nonaqueous electrolyte type lithium ion secondary battery subject to determination before and after obtaining the charging voltage and discharging voltage by the voltage obtaining part for repeating calculation of the coefficient by the coefficient calculating part is less than a previously set threshold increasing rate, and there is a possibility of lithium deposition when the increasing rate of resistance in the nonaqueous electrolyte type lithium ion secondary battery is as high as the threshold increasing rate or higher.

This is because a tendency has been found that the increasing rate of battery resistance is small unless lithium deposition occurs and the battery resistance remarkably rises when lithium deposition has occurred.

The invention is also applicable to a nonaqueous electrolyte type lithium ion secondary battery system comprising: a power source part constituted of the nonaqueous electrolyte type lithium ion secondary battery or a plurality of the batteries; and a loading part for generating driving force in response to a discharging current from the power supply part and supplying a charging current resulting from energy regeneration to the power supply part, the voltage obtaining part being arranged to obtain charging voltage and discharging voltage of the nonaqueous electrolyte type lithium ion secondary battery of the power supply part. A vehicle may be applicable in which the loading part is a motor for driving to rotate wheels.

Furthermore, when the target nonaqueous electrolyte type lithium ion secondary battery uses natural graphite as a negative electrode material, it has only to obtain discharging voltage and calculate a coefficient of a quadratic term on discharging voltage. Thus, if the calculated coefficients of discharging voltage are positive, it is determined that there is no possibility of lithium deposition in the nonaqueous electrolyte type lithium ion secondary battery. If the coefficients are negative, it is determined that there is a possibility of lithium deposition.

Advantageous Effects of Invention

The invention can provide a nonaqueous electrolyte type lithium ion secondary battery system capable of determining whether or not there is a possibility that lithium deposition is actually occurring, without disassembling a battery, a method of determining lithium deposition in the system, and a vehicle mounting the system.

DESCRIPTION OF EMBODIMENTS

A detailed description of a preferred embodiment of the present invention will now be given referring to the accompanying drawings. A determining method of the invention explained in the following embodiments is based on knowledge of the present inventors who made a charging and discharging test on a number of nonaqueous electrolyte type lithium ion secondary batteries (hereinafter, simply referred to as "battery(s)") and disassembled the batteries after the test and confirmed the presence/absence of lithium deposition. Specifically, the present inventors found out that the tendency of changes in charging voltage and discharging voltage obtained by the charging and discharging test of batteries has a close relationship with the occurrence of lithium deposition.

First Embodiment

Figure 1:
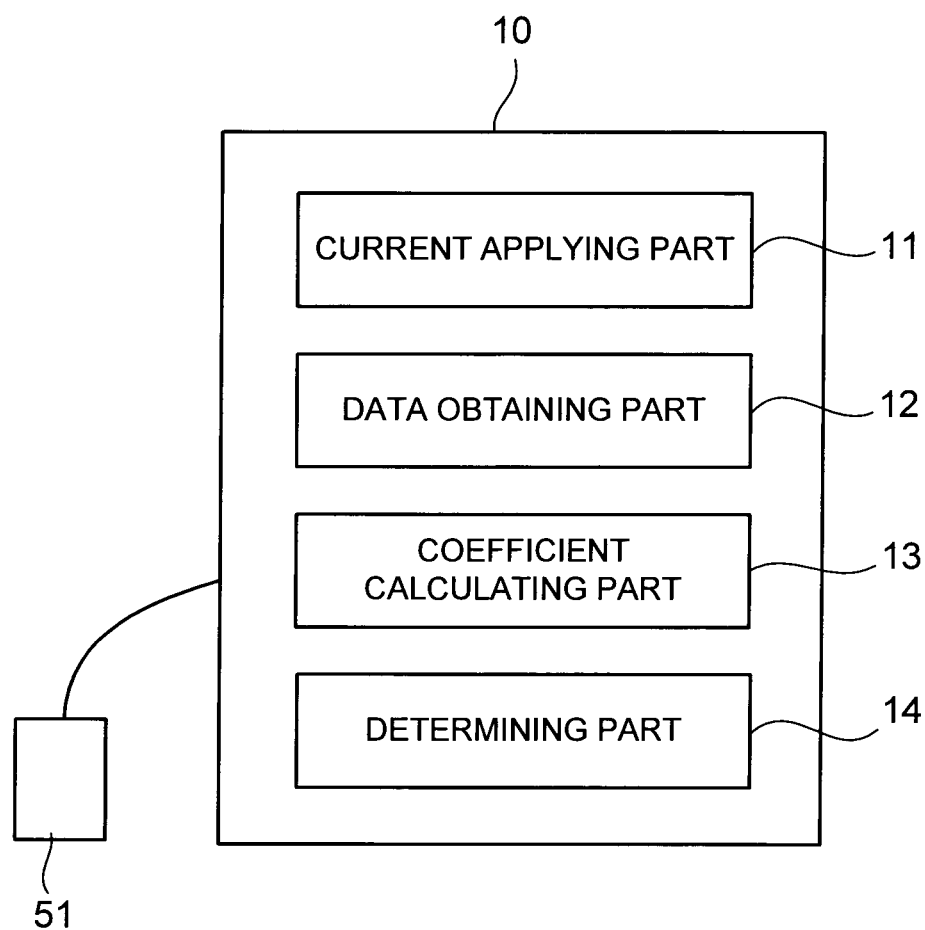
FIG. 1 is a block diagram showing a battery system in an embodiment.

FIG. 1 shows a nonaqueous electrolyte type lithium ion secondary battery system (hereinafter, simply referred to as a "battery system") 10 in the present embodiment. The battery system 10 in FIG. 1 is intended to make a lithium deposition test of a battery 51 by connection therewith. Based on results of the test, the battery system 10 determines whether or not lithium deposition has occurred in the battery 51 without disassembling the battery 51. In the first embodiment, a negative electrode material for the battery 51 may include a material made of artificial graphite or natural graphite coated with low crystalline carbon. As an alternative, the negative electrode material may also include a material made of artificial graphite or natural graphite mixed with low crystalline carbon at a ratio of 20 weight % or less. The following explanation will be made on the case of using the material made of natural graphite coated with low crystalline carbon.

The battery system 10 in FIG. 1 includes a current applying part 11, a data obtaining part 12, a coefficient calculating part 13, and a deposition determining part 14. The current applying part 11 is arranged to apply a current to the battery 51. The current applying part 11 can apply a current in a direction to charge the battery 51 and also a current in a direction to discharge the battery 51.

The data obtaining part 12 is arranged to obtain voltage and resistance of the battery 51. Relating to the voltage, specifically, the data obtaining part 12 obtains charging voltage when the current applying part 11 applies a charging current to the battery 51 and obtains discharging voltage when the current applying part 11 applies a discharging current to the battery 51. The coefficient calculating part 13 is arranged to calculate a coefficient of a quadratic term when changes with time of each of the charging voltage and discharging voltage are approximated by a quadratic curve. The details thereof will be described later. The deposition determining part 14 is arranged to determine whether or not there is a possibility that lithium deposition has occurred in the battery 51, and others. The details of the determination will also be described later.

The determination by the battery system 10 in FIG. 1 is conducted in the following steps:

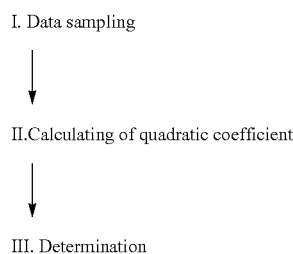

The steps will be explained below in turn.
I. Data Sampling
Firstly, the data obtaining part 12 samples necessary data, beginning with obtaining initial resistance of the battery 51. The data obtaining part 12 then obtains charging voltage and discharging voltage. For that purpose, the current applying part 11 applies a current to the battery 51. This current application is repeatedly performed while inverting a current-supplying direction under the following conditions, for example. Herein, "C" is a unit representing a current value at which a target battery is brought from full charging into full discharging by discharging for one hour.

Applied current: 15 C
Time for one current application: 10 seconds

This current value of 15 C corresponds to about 10 to 20 mA/cm$^2$ in current density on an electrode surface of a battery for a hybrid electric vehicle. While the above current application is performed, the attained voltage of the battery 51 is measured every time the current applying direction is inverted. The voltage obtained after application of charging current is referred to as "charging voltage" and the voltage obtained after application of discharging current is referred to as "discharging voltage". The above sampling of voltage values is repeated about several hundred cycles. Then, final resistance of the battery 51 is obtained.

II. Calculation of Quadratic Coefficient

Based on the charging voltage and the discharging voltage obtained in "I.", successively, their quadratic coefficients are calculated. A coefficient of a quadratic term obtained when variations or changes with time of voltage values are approximated by a quadratic function. Concrete steps thereof are as follows.

II-1. Plot of Voltage Value

Figure 2:
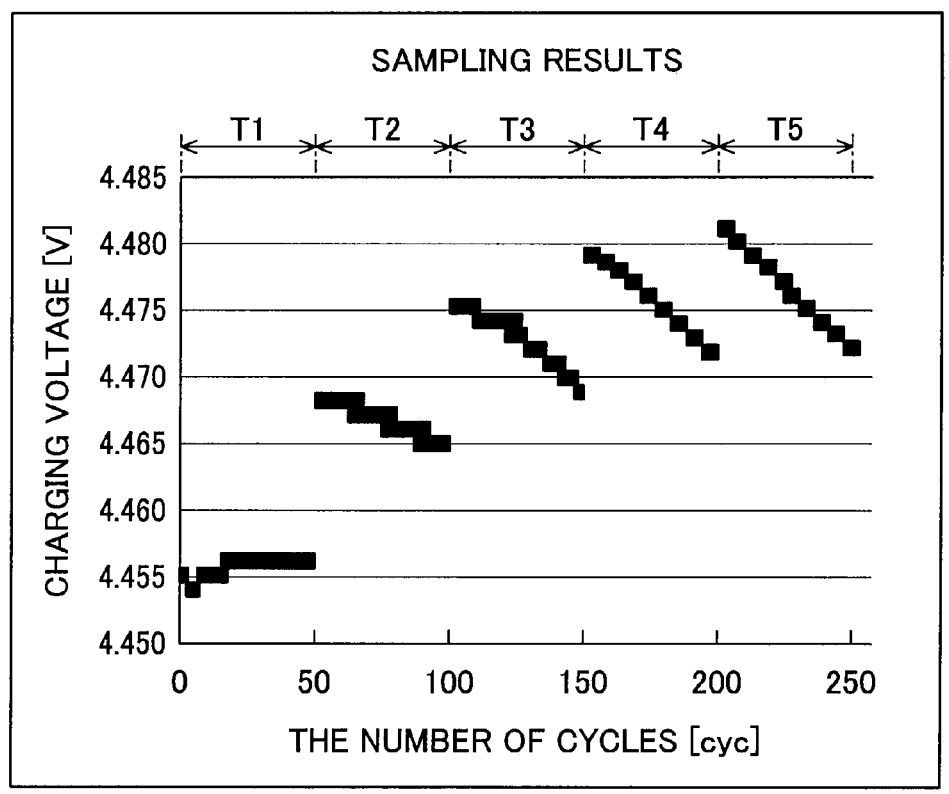
FIG. 2 is a graph plotting sampled charging voltages.

Voltage values as sampling results are plotted in a graph with a vertical axis indicating voltage and a horizontal axis indicating time (more specifically, cycle number). This graph is created for each of charging voltage and discharging voltage. FIG. 2 is one example of the created graph. Although the graph in FIG. 2 relates to charging voltage, another graph is also similarly made on discharging voltage. The graph in FIG. 2 shows the results of sampling conducted under the following conditions.

Outside air temperature: 0° C.
Battery SOC (State of Charge) at the start of sampling: 60%

In sampling for creating the graph in FIG. 2, further, the sampling is temporarily stopped every 50 cycles, and then started again after the SOC of the battery 51 is adjusted to 60%. Accordingly, the data in FIG. 2 is greatly displaced every 50 cycles. In the present embodiment, therefore, the period of each 50 cycles is referred to as a "Sampling Period". In FIG. 2, five sampling periods T1 to T5 are present. This periodic readjustment of SOC (State of Charge) is not always necessary for determining lithium deposition.

II-2. Application of Approximated Curve

Next, an approximated curve is fitted to the graph in FIG. 2. This fitting is performed on each of the sampling periods T1 to T5 in FIG. 2. The approximated curve to be used is expressed by a quadratic function with "x" on horizontal axis and "y" on the vertical axis.

$$y = Bx^2 + Ex + F \quad (1)$$

Figure 3:
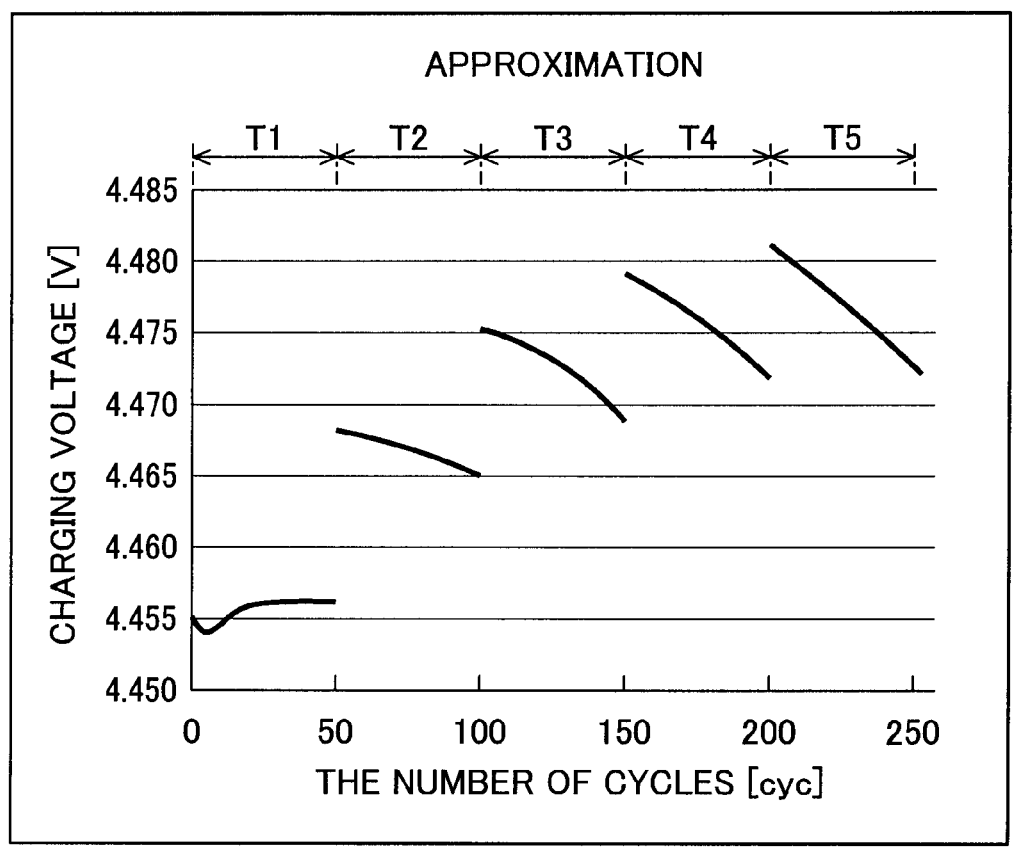
FIG. 3 is a graph showing results of applying approximate curves to the graph shown in FIG. 2.

This fitting is performed by adjusting coefficients B, E, and F in the expression (1) so that an error between the graph in FIG. 2 and the curve represented by the expression (1) is minimum. Specifically, each coefficient may be calculated according to a least-square method or other known mathematic methods. FIG. 3 is a graph showing the result of fitting of the approximated curves. Accordingly, each curve in FIG.

3 is a part of a parabola. This fitting of approximated curves is performed not only on charging voltage but also on discharging voltage.

II-3. Decision of Quadratic Coefficient

A quadratic coefficient is then decided. The coefficient to be decided is a coefficient of a quadratic term in the expression (1), that is, a coefficient B. This is decided in each sampling period and also on each of charging voltage and discharging voltage. Specifically, assuming that the number of sampling periods is "n", a coefficient of charging voltage (a charging voltage coefficient) is BCn and a coefficient of discharging voltage (a discharging voltage coefficient) is BDn, the following coefficients are obtained.

Sampling period: T1, T2, . . . , Tn, . . . .
Charging voltage coefficient: BC1, BC2, . . . , BCn, . . . .
Discharging voltage coefficient: BD1, BD2, . . . , BDn, . . . .

Each of the coefficients BCn and BDn obtained as above can be considered as below. Specifically, when the corresponding curve in FIG. 3 is convex downward, its coefficient is a positive value. Contrarily, when the corresponding curve is convex upward, its coefficient is a negative value.

The decision of the coefficients may also be achieved by calculating using differentiation instead of the fitting of approximated curves. Specifically, the coefficient may be obtained as an average value in the relevant sampling period, the average value being calculated from values each obtained by differentiating the corresponding voltage value twice.

III. Determination

Figure 4:
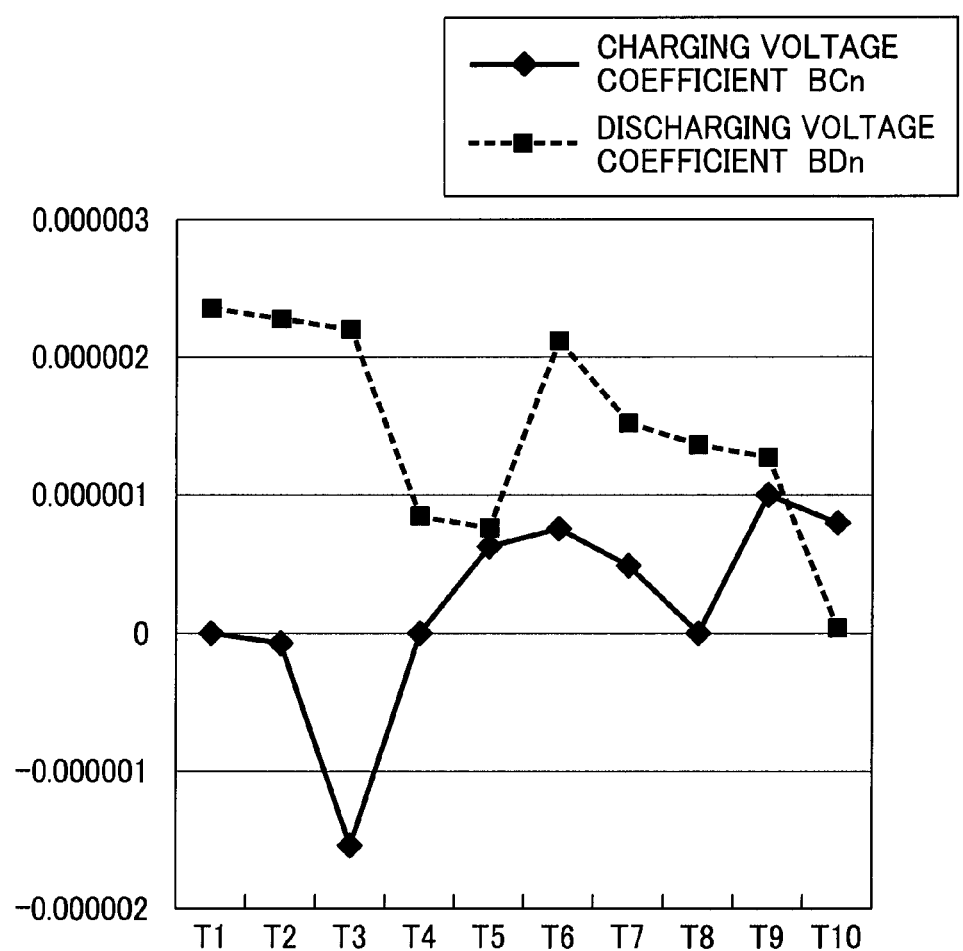
FIG. 4 is a graph plotting calculated coefficients.

Based on the coefficients obtained in "II.", it is determined whether or not there is a possibility that lithium deposition has occurred in the battery 51. This determination is performed based on a graph shown in FIG. 4. The graph in FIG. 4 is created by plotting the coefficients obtained in "II.", putting the number for sampling period on the horizontal axis. The graph also shows a line graph joining charging coefficients BCn and a line graph joining discharging coefficients BDn. Such a graph as shown in FIG. 4 is hereinafter referred to as a coefficient plot diagram. FIG. 4 is one example thereof. This determination is made mainly based on the occurrence situation of the following two kinds of phenomena in the coefficient plot diagram.

(a) Symmetry phenomenon
(b) Intersection phenomenon
(a) Symmetry Phenomenon

An explanation is first made on what the symmetry phenomenon is. Herein, the symmetry phenomenon represents a phenomenon that the charging voltage coefficient BCn and the discharging voltage coefficient BDn are increased/decreased in opposite directions to each other between adjacent sampling periods. In other words, focusing attention on a certain sampling period Tn and a subsequent sampling period T(n+1), the symmetry phenomenon is regarded to have occurred in the case where one coefficient increases (to the upper right in the coefficient plot diagram) and the other coefficient decreases (to the lower right in the coefficient plot diagram).

More concretely, the case where $BCn<BC(n+1)$ and $BDn>BD(n+1)$ or the case where $BCn>BC(n+1)$ and $BDn<BD(n+1)$ is the symmetry phenomenon. In FIG. 4, the symmetry phenomenon appears in three sections: T3→T4, T4→T5, and T8→T9.

(b) Intersection Phenomenon

Next, an explanation is made on what the intersection phenomenon is. Herein, the intersection phenomenon represents a phenomenon that a magnitude relation between the charging voltage coefficient BCn and the discharging voltage coefficient BDn is reversed between the adjacent sampling periods. In other words, if the line graphs in the coefficient plot diagram intersect with each other, the intersection phenomenon is regarded to have occurred.

More concretely, the case where $BCn<BDn$ and $BC(n+1)>BD(n+1)$ or the case where $BCn>BDn$ and $BC(n+1)<BD(n+1)$ is the intersection phenomenon. The intersection phenomenon in FIG. 4 appears in only one section, T9→T10. The symmetry phenomenon and the intersection phenomenon may occur simultaneously or only either one of them may occur. In FIG. 4, however, there is no section where both phenomena have occurred at the same time.

Figure 5:
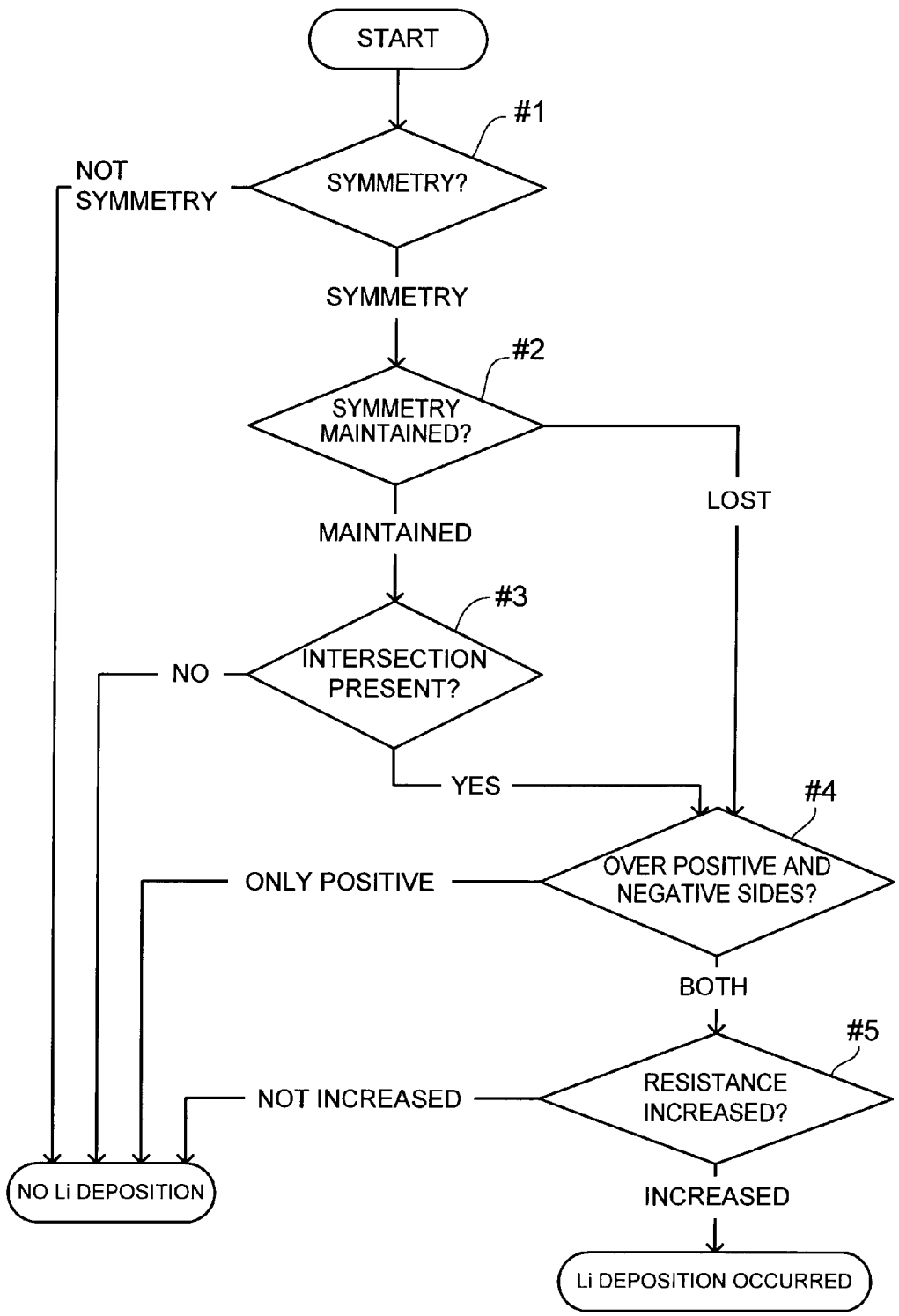
FIG. 5 is a flowchart showing steps of determining lithium deposition in a first embodiment.

A concrete determining sequence based on the above two kinds of phenomena is as shown in a flowchart in FIG. 5. This is explained below. For determination using the flowchart in FIG. 5, a coefficient plot diagram covering five or more sampling periods is required.

(#1: Determination Whether "Symmetry" or "Not Symmetry")

In this flowchart, it is first determined whether the coefficient plot diagram of a target to be determined is "Symmetry" or "Not symmetry". Concretely, it is determined based on high and low of the appearance frequency of the symmetry phenomenon explained in (a). Specifically, a threshold is set in advance for the appearance frequency of the symmetry phenomenon. As this threshold, for example, a value as much as about 70% is set. If the appearance frequency of the symmetry phenomenon in the coefficient plot diagram is as high as the threshold or higher, the coefficient plot diagram is determined as "Symmetry". On the other hand, if the appearance frequency of symmetry phenomenon is less than the threshold, the coefficient plot diagram is determined as "Not symmetry".

Instead of setting the threshold for the appearance frequency, a threshold may be set for the number of sampling periods in which the symmetry phenomenon continuously appears. In this case, for example, a value as much as about three periods is set. In the coefficient plot diagram, if there are sections in which the symmetry phenomenon continuously appears over the number of periods as large as or larger than the threshold, the coefficient plot diagram is determined as "Symmetry". On the other hand, if even the maximum number of periods in which the symmetry phenomenon continuously appears is less than the threshold, the coefficient plot diagram is determined as "Not symmetry".

Alternatively, the threshold for appearance frequency and the threshold for the number of continuous periods may be used simultaneously. To be concrete, it may be arranged to determine the coefficient plot diagram is "Symmetry" if either one of the appearance frequency and the number of continuous periods is as high as the threshold or more or the coefficient plot diagram is "Not symmetry" if both the appearance frequency and the number of continuous periods are less than the thresholds.

According to the test conducted by the present inventors, the batteries 51 determined as "Not symmetry" by the above method were disassembled but the occurrence of lithium deposition was not found in any of the batteries 51. On the other hand, the batteries 51 determined as "Symmetry" were disassembled and the occurrence of lithium deposition was found in some of the batteries 51.

By the above determination whether "Symmetry" or "Not symmetry", it is possible to determine whether or not there is a possibility that the lithium deposition has occurred, without disassembling the batteries 51. In other words, if the coefficient plot diagram is "Not symmetry", it can be determined that no lithium deposition has occurred in the battery 51. On the other hand, if the coefficient plot diagram is "Symmetry", the possibility that lithium deposition has occurred cannot be denied. However, based on only this respect, it cannot be concluded that lithium deposition has occurred.

Figure 6:
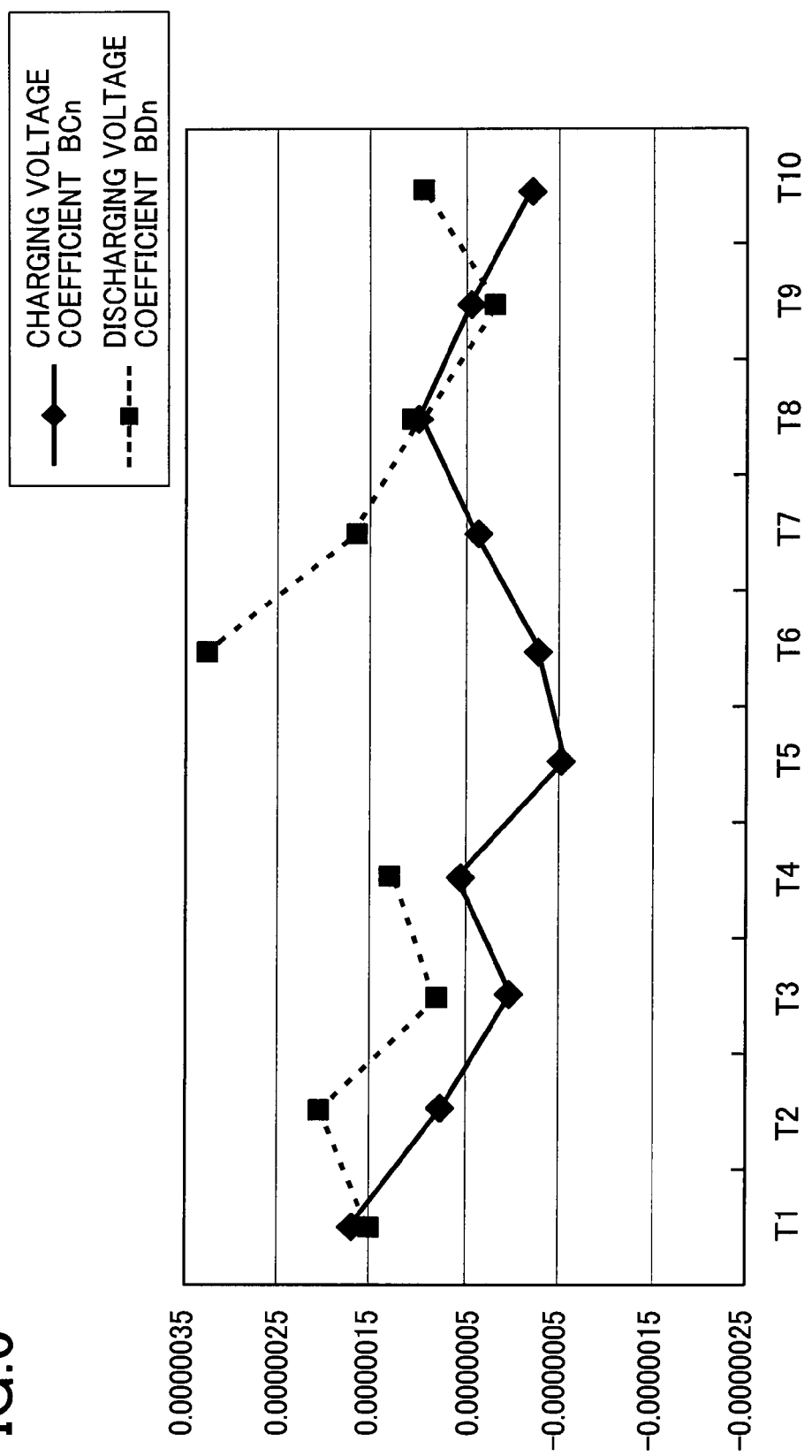
FIG. 6 is a graph showing one example of a coefficient plot diagram, determined as "Not symmetry"

FIG. 6 shows a part of an example of the coefficient plot diagram determined as "Not symmetry". In the example in FIG. 6, the occurrence frequency of the symmetry phenomenon is low (4 times/9 times). Thus, the example in FIG. 6 is determined as "Not symmetry". The example in FIG. 6 shows the case where data sampling was conducted under the conditions that the current density was not so high (15.2 mA/cm$^2$), that is, that lithium deposition was less likely to occur. Even in such a low load condition, the coefficient plot diagram may become "Symmetry" after long-term endurance use. In such a case, the possibility that lithium deposition has occurred cannot be denied. A capacity retaining ratio of the battery 51 at the time after the sampling period T10 in the example in FIG. 6 was 97%.

If the coefficient plot diagram is determined as "Not symmetry", the determination based on the flowchart in FIG. 5 is terminated without conducting subsequent steps. This is because it is found that it can be determined that there is no possibility of lithium deposition. If the coefficient plot diagram is determined as "Symmetry", the determination is further continued, because there is a possibility of lithium deposition.

(#2: Determination Whether "Symmetry" is Maintained or Not)

If the coefficient plot diagram is determined as "Symmetry", it is subsequently determined whether or not the condition "Symmetry" is maintained. That the "Symmetry" is maintained indicates that the occurrence frequency of the symmetry phenomenon shows no tendency of decreasing with time. Contrarily, if the occurrence frequency of the symmetry phenomenon shows a tendency of decreasing with time, it is referred to as that the "Symmetry" is not maintained or lost.

Figure 7:
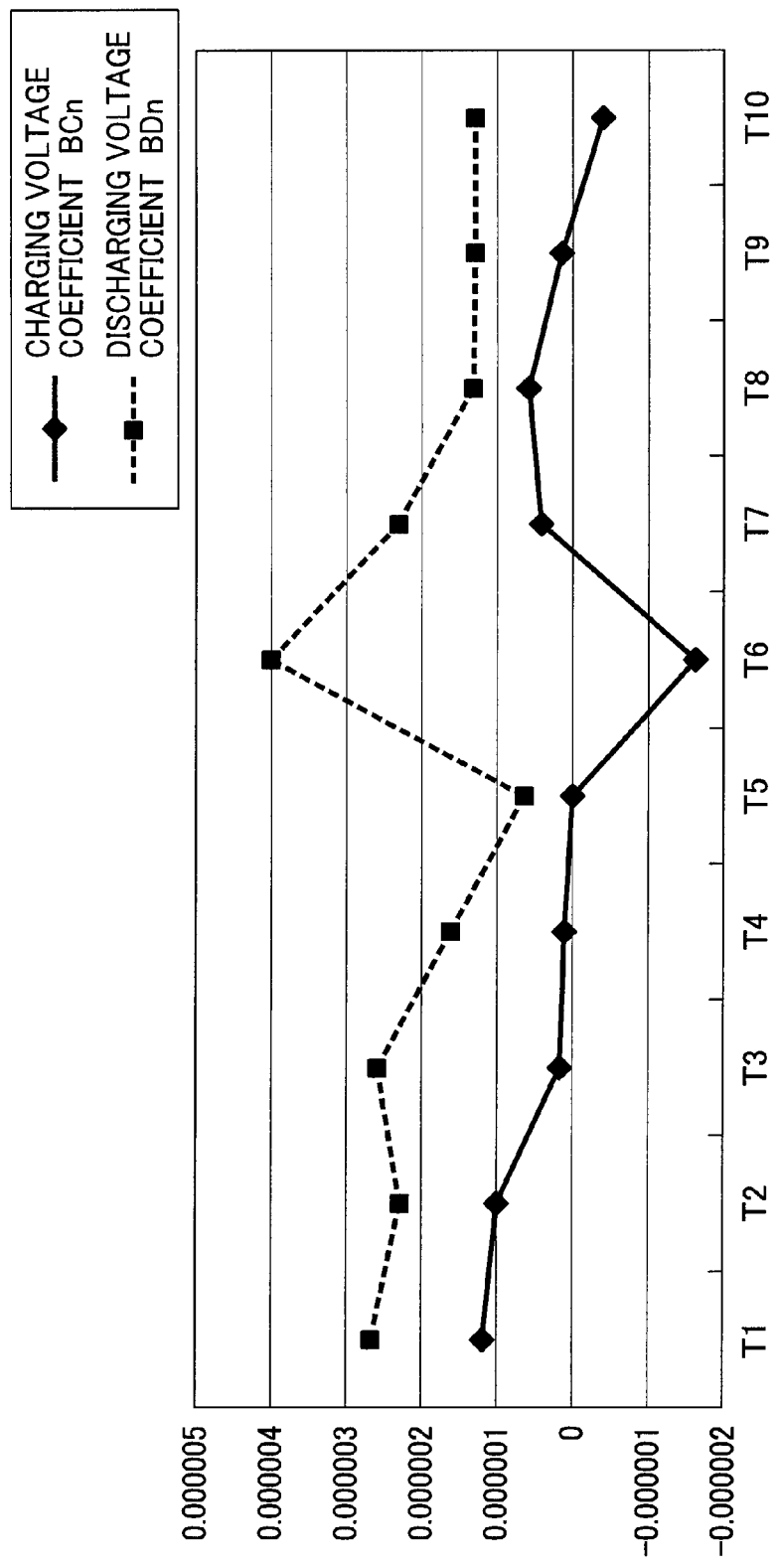
FIG. 7 is a graph showing one example of the coefficient plot diagram, determined that "Symmetry" is not maintained and coefficients are distributed mainly on a positive side.

In an example in FIG. 7, for example, the symmetry phenomenon continuously occurs in a section from T5 to T8 but no symmetry phenomenon appears after T8. Specifically, the occurrence frequency of symmetry phenomenon before and after the sampling period T8 decreases. The example in FIG. 7 is therefore determined in #2 that the "Symmetry" is NOT maintained. It is to be noted that the example in FIG. 7 shows the case where data sampling was conducted with a current density of 18.8 mA/cm$^2$. A capacity ratio of the battery 51 at the time after the sampling period T10 in the example in FIG. 7 was 97%.

For this determination, concretely, a threshold may be set for differential in occurrence frequency of symmetry phenomenon. If the frequency decreases with a differential larger than the threshold before and after a certain sampling period set as a boundary, it is determined that the "Symmetry" is NOT maintained. On the other hand, if such determination could not be achieved even if any sampling period is set as a boundary, it is determined that the "Symmetry" is MAINTAINED. Comparing the case where the "Symmetry" is maintained and the case where the "Symmetry" is not maintained, the lithium deposition is more likely to occur in the case where the "Symmetry" is not maintained.

(#3: Determination on Presence/Absence of Intersection)

When it is determined that the "Symmetry" is maintained, it is subsequently determined whether intersection is present or not in the coefficient plot diagram of the target to be determined. Concretely, it is determined based on whether or not the intersection phenomenon in (b) mentioned above has occurred.

According to the test conducted by the present inventors, the batteries 51 determined that the intersection is absent by the above method were disassembled but no occurrence of lithium deposition was found in any of the batteries 51. Specifically, if the "Symmetry" is maintained and the intersection is absent, no lithium deposition occurs in even the battery or batteries 51 determined that the coefficient plot diagram is "Symmetry" in #1. On the other hand, the batteries 51 determined that the intersection is present were disassembled and the occurrence of lithium deposition was found in some of the batteries 51.

By the above determination whether the "Symmetry" is maintained or not and whether the intersection is present or not, it is possible to determine whether or not there is a possibility that the lithium deposition has occurred, without disassembling the battery 51. In other words, if the "Symmetry" in the coefficient block diagram is maintained and the intersection is absent, it can be determined that no lithium deposition has occurred in the battery(s) 51. On the other hand, if the "Symmetry" is not maintained or if the intersection is present, the possibility that lithium deposition has occurred cannot be denied. There is at least a possibility that deterioration in battery performance has begun. However, it cannot be concluded from only this respect that lithium deposition has occurred.

Figure 8:
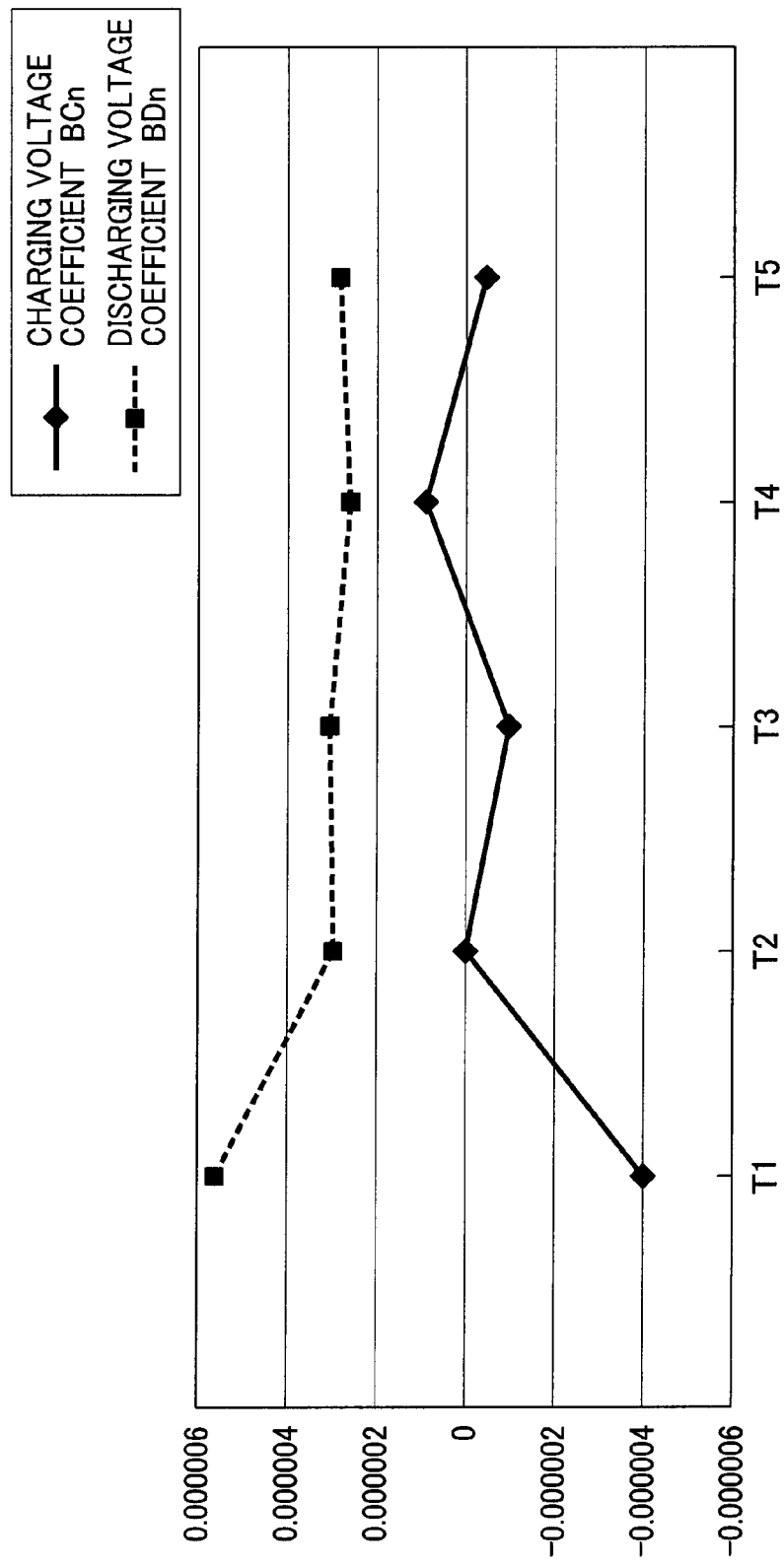
FIG. 8 is a graph showing one example of the coefficient plot diagram, determined that "Symmetry" is maintained and "Intersection" is absent.

FIG. 8 shows a part of the example of a coefficient plot diagram determined that the "Symmetry" is maintained but the intersection is absent. In the example in FIG. 8, no particular decrease in the occurrence frequency of symmetry phenomenon is found. In addition, no intersection phenomenon has occurred. Thus, in the example in FIG. 8 is determined in #3 that the intersection is absent. It is to be noted that the example in FIG. 8 shows the case where data sampling was conducted with a current density of 18.8 mA/cm$^2$. A capacity retaining ratio of the battery 51 at the time after the sampling period T5 in the example in FIG. 8 was 98%.

If it is determined that the "Symmetry" is maintained but the intersection is absent, the determination based on the flowchart is terminated without conducting subsequent steps. This is because it is found that it can be determined that there is no possibility of lithium deposition. If the determination in #2 concludes that the "Symmetry" is not maintained or if the determination in #3 concludes that the intersection is present, the determination is further continued, because there is a possibility of lithium deposition. It is to be noted that the order of the determination in #2 and the determination in #3 may be interchanged. In other words, it may be arranged to first determine the presence/absence of intersection and then, only if the intersection is absent, determine whether or not the "Symmetry" is maintained.

For determining the presence/absence of intersection, a threshold frequency may be set as in the determination whether "Symmetry" or not. It is determined that the intersection is present if the occurrence frequency of the intersection phenomenon in the coefficient plot diagram is as high as the threshold or more and that the intersection is absent if the occurrence frequency of intersection phenomenon is less than the threshold.

(#4: Determination on Coefficient Distribution)

In case that it is determined that the "Symmetry" is not maintained and in case that the intersection is present, a subsequent determination is conducted. This determination is to determine a distribution situation of the charging voltage coefficients and the discharging voltage coefficients in the coefficient plot diagram with respect to the vertical axis direction. To be concrete, it is determined which one of the following two patterns corresponds to the distribution situation of the charging voltage coefficients and the discharging voltage coefficients in the coefficient plot diagram with respect to the vertical axis direction.

Distributed mainly on a positive side.

Distributed on both of a positive side and a negative side.

It is found from the test conducted by the present inventors that a result "Distributed mainly on a negative side" was not obtained.

For this determination, it is only necessary to set a threshold (e.g., 80%) in advance about the ratio of positive coefficients to the total number of charging voltage coefficients and discharging voltage coefficients in the coefficient plot diagram. If the relevant ratio in the coefficient plot diagram of the target to be determined is as high as the threshold or more, it is determined that the coefficients are "Distributed mainly on a positive side". On the other hand, if the relevant ratio is less than the threshold, it is determined that the coefficients are "Distributed on both the positive and negative sides".

According to the test conducted by the present inventors, when the batteries 51 determined by the above method to be "Distributed mainly on a positive side" were disassembled, the occurrence of lithium deposition was not found in any of the batteries 51. On the other hand, when the batteries 52 determined to be "Distributed on both the positive and negative sides" were assembled, the occurrence of lithium deposition was found in a significant number of the batteries.

Accordingly, by the determination on the distribution of coefficients, it is possible to judge whether or not there is a possibility that the lithium deposition has occurred, without disassembling the battery 51. If the coefficients are distributed mainly on the positive side, it can be judged that the lithium deposition has not occurred in the battery 51. On the other hand, if the coefficients are distributed on both the positive and negative sides, the possibility that lithium deposition has occurred cannot be denied. There is at least a possibility that deterioration of battery performance has proceeded to some extent. However, this is not still enough to conclude that the lithium deposition has occurred.

Figure 9:
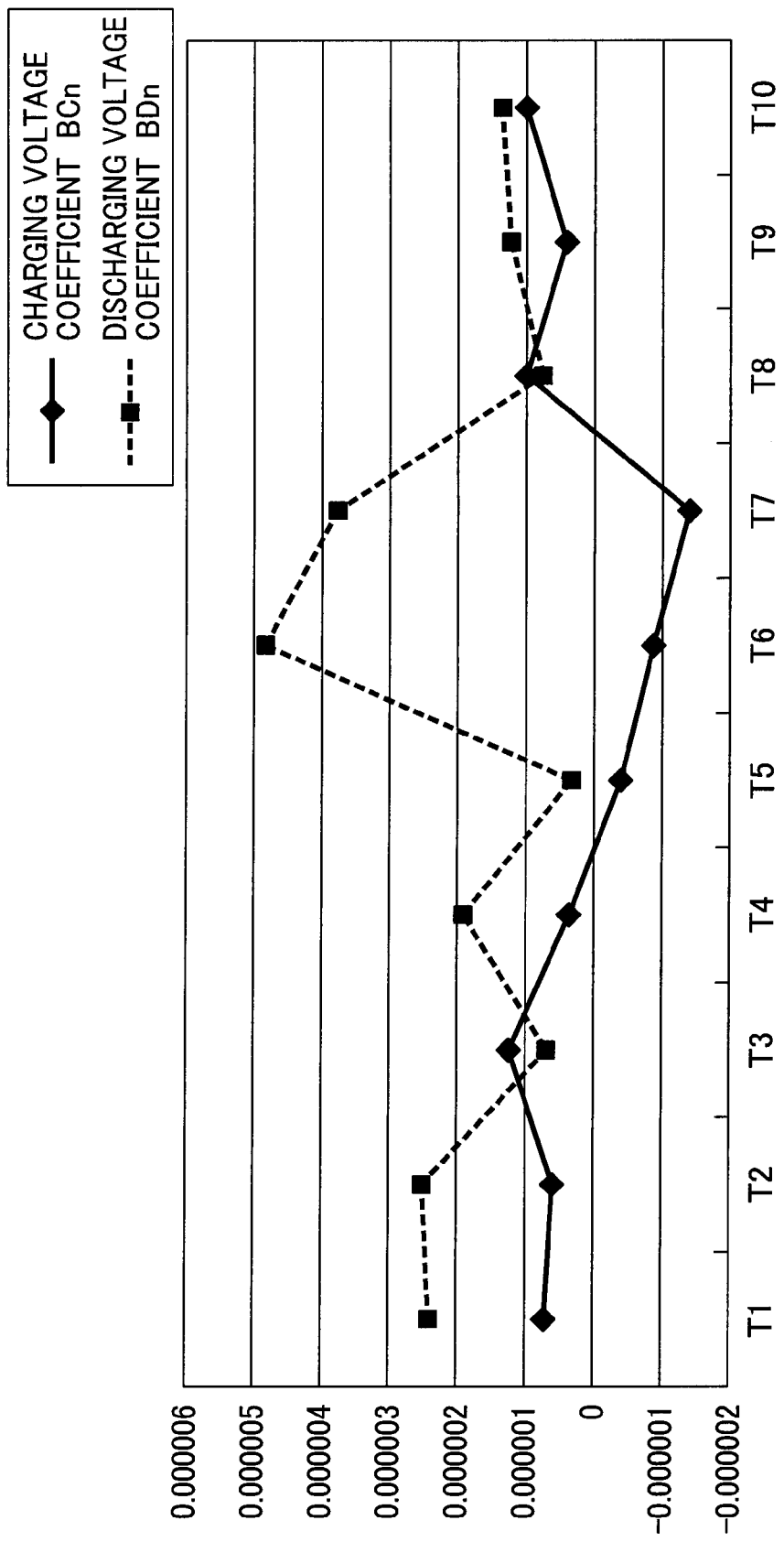
FIG. 9 is a graph showing one example of the coefficient plot diagram, determined that "Intersection" is present and coefficients are distributed mainly on a positive side.

An example determined to be "Distributed mainly on a positive side" is for example shown in FIGS. 7 and 9. FIG. 7 shows the example already explained as an example to be determined that the condition "Symmetry" is present but the "Symmetry" is not maintained. In the example in FIG. 7, only charging voltage coefficients at T6 and T10 are obviously negative coefficients and other coefficients are almost zero or clearly positive coefficients. It is thus determined in #4 to be "Distributed mainly on the positive side".

FIG. 9 shows an example that the Symmetry determination concludes that the "Symmetry" is present and the intersection determination concludes that the intersection is present. In the example in FIG. 9, only the charging voltage coefficients at T5 to T7 are obviously negative coefficients and other coefficients are obviously positive coefficients. Thus, the determination in #4 concludes "Distributed mainly on the positive side". The example in FIG. 9 shows an example in which data sampling was conducted with a current density of 17.6 mA/cm$^2$. A capacity retaining ratio of the battery 51 at the time after the sampling period T10 in the example in FIG. 9 was 96%.

Figure 10:
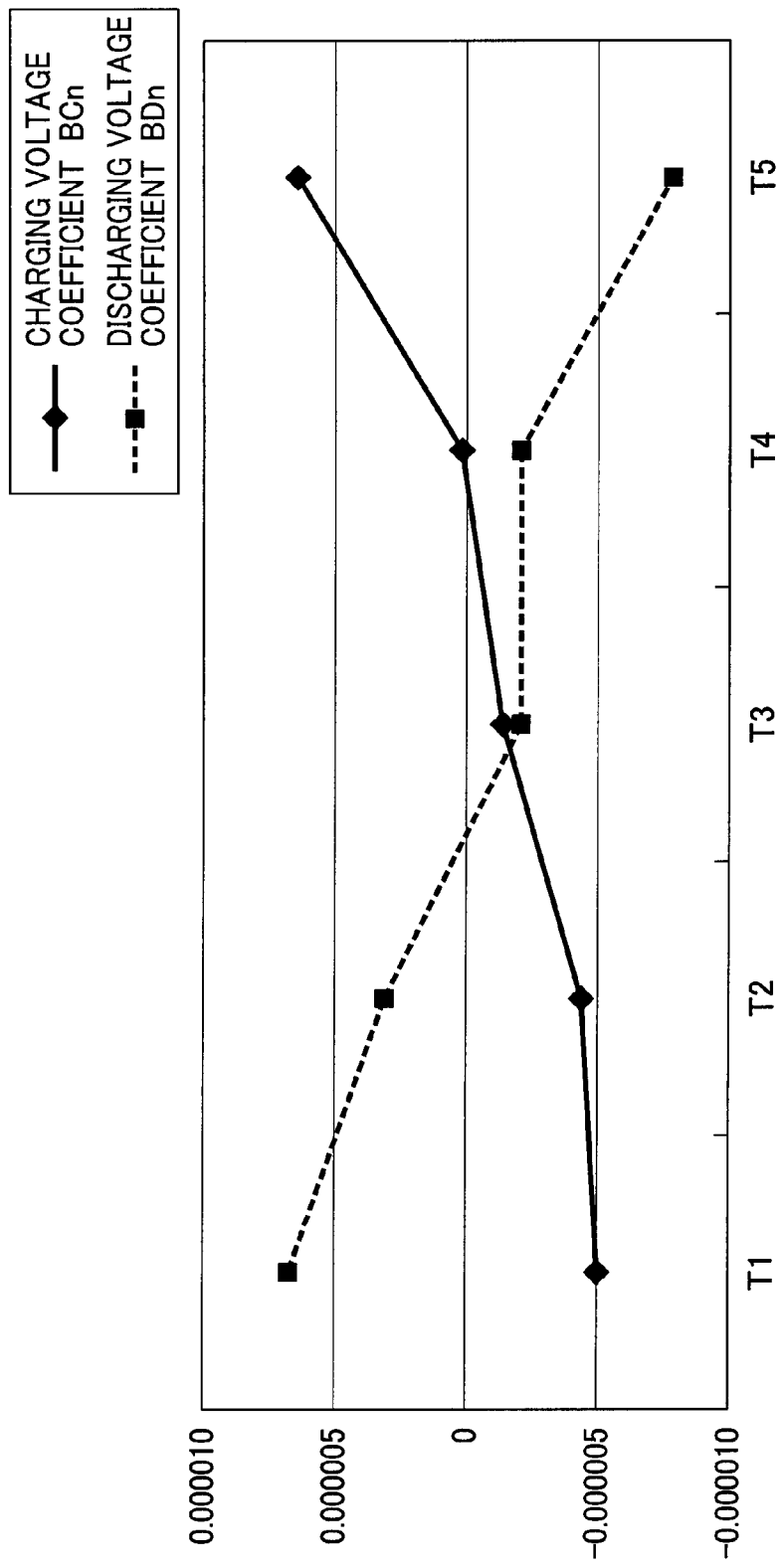
FIG. 10 is a graph showing one example of the coefficient plot diagram, determined that "Intersection" is present and coefficients are distributed on both positive and negative sides.
Figure 11:
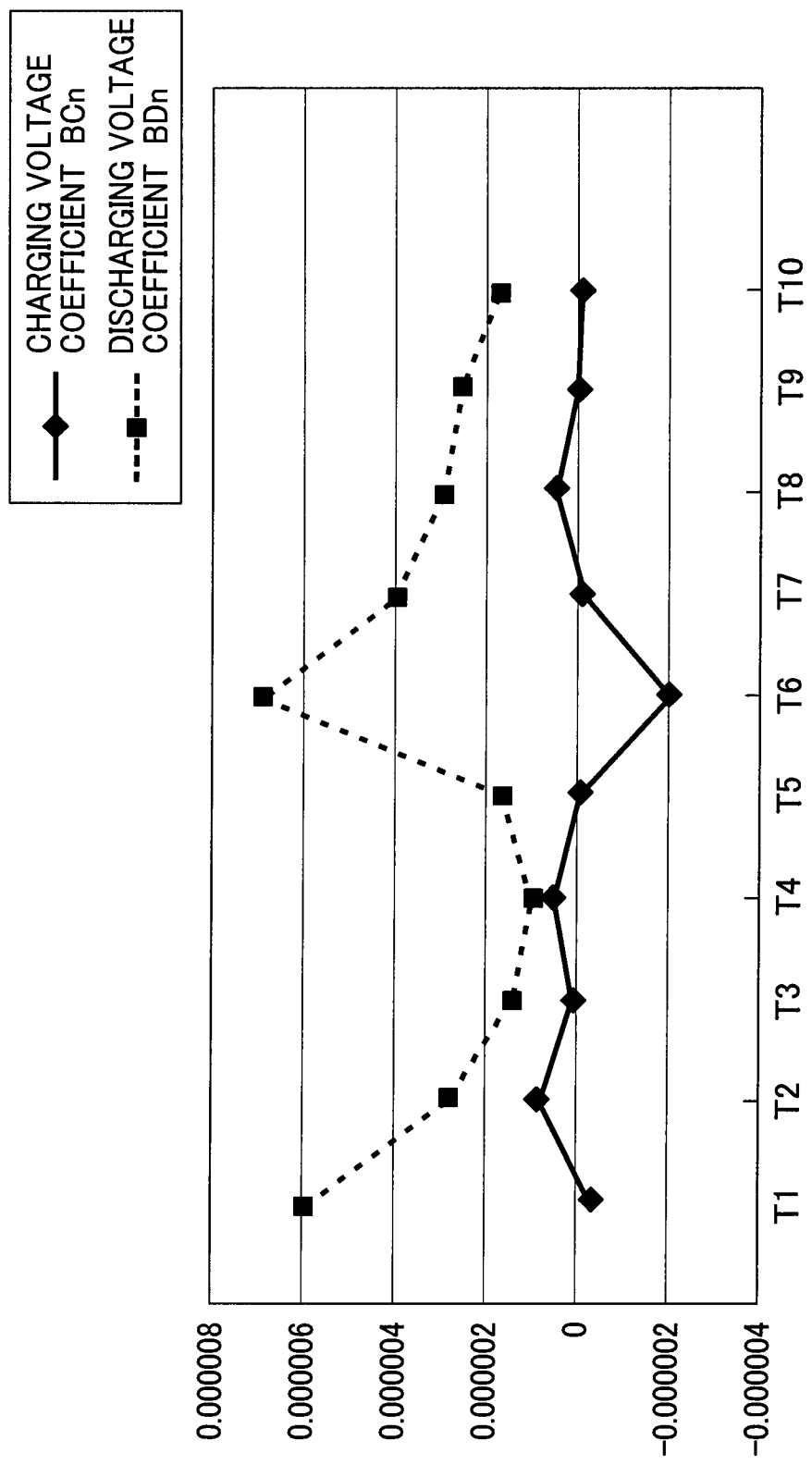
FIG. 11 is a graph showing one example of the coefficient plot diagram, determined that "Symmetry" is not maintained and coefficients are distributed on both positive and negative sides.

The example to be determined to be "Distributed on both the positive and negative sides" is shown for example in FIGS. 10 and 11. FIG. 10 shows an example that the Symmetry determination concludes that the "Symmetry" is present and the intersection determination concludes that the intersection is present. This condition is identical to FIG. 9. In the example in FIG. 10, the coefficients are distributed almost evenly on both the positive and negative sides. Thus, the determination in #4 concludes "Distributed on both the positive and negative sides". The example in FIG. 10 is an example that data sampling was conducted with a current density of 20.0 mA/cm$^2$. A capacity retaining ratio of the battery 51 at the time after the sampling period T5 in the example in FIG. 10 was 73%.

FIG. 11 shows an example that the Symmetry determination concludes that the "Symmetry" is present but the "Symmetry" is not maintained. This condition is identical to FIG. 7. In the example in FIG. 11, the coefficients are distributed on both the positive and negative sides. Thus, the determination in #4 concludes "Distributed on both the positive and negative sides". The example in FIG. 11 is an example that data sampling was conducted with a current density of 15.2 mA/cm$^2$. A capacity retaining ratio of the battery 51 at the time after the sampling period T10 in the example in FIG. 11 was 96%.

In the distribution determination in #4, the examples including the intersections as in FIGS. 9 and 10 can be determined based on the position of each intersection. Specifically, in the coefficient plot diagram in FIG. 9, four intersections (between T2 and T3, between T3 and T4, between T7 and T8, and between T8 and T9) appear on the positive side with respect to the vertical axis. From this view, the example in FIG. 9 is determined to be "Distributed mainly on the positive side". On the other hand, in the coefficient plot diagram in FIG. 10, one intersection (between T2 and T3) appears on the negative side with respect to the vertical axis. From this view, the example in FIG. 10 is determined to be "Distributed on both the positive and negative sides".

For conducting the determination according to this method, it is only necessary to set a threshold (e.g., about 80%) for the ratio of intersections located on the positive side with respect to the total number of intersections in the coefficient plot diagram. If the relevant ratio in the coefficient plot diagram of a target to be determined is as high as the threshold or more, it is determined that the coefficients are "Distributed mainly on the positive side". On the other hand, if the relevant ratio is less than the threshold, it is determined that the coefficients are "Distributed on both the positive and negative sides".

If the determination concludes "Distributed mainly on the positive side", the determination by the flowchart in FIG. 5 is terminated without conducting the subsequent steps. This is because it is found that it can be determined that there is no possibility of lithium deposition. If the determination concludes "Distributed on both the positive and negative sides", the determination is further continued, because there is a possibility of lithium deposition.

(#5: Determination on Increasing Tendency of Resistance Value)

If it is determined that the coefficients are distributed on both the positive and negative sides, a final determination is conducted. This final determination is made on a resistance value of the battery 51 obtained before and after the data sampling, not on the coefficient plot diagram. To be concrete, it is determined whether or not an increasing rate of a final resistance R2 with respect to an initial resistance R1 in the battery 51:

$$(R2-R1)/R1$$

is large. For determination, a threshold (e.g., about 30%) is set in advance for the increasing rate. The determination is made by comparison of the rate with the threshold.

According to the test conducted by the present inventors, when the batteries 51 with a small increasing rate of resistance were disassembled, the occurrence of lithium deposition was not found in any of the batteries 51. On the other hand, when the batteries 51 with a large increasing rate of resistance were disassembled, the occurrence of lithium deposition was confirmed in most of the batteries 51.

The determination of the resistance increasing rate can be considered as a final judgment about whether or not lithium deposition has occurred in the battery 51. In other words, the batteries 51 with a small increasing rate of resistance can be determined, without being disassembled, that the lithium deposition has not occurred. However, there is a possibility that deterioration of battery performance has proceeded to some extent. On the other hand, the batteries 51 with a large increasing rate can be determined, without being disassembled, that the lithium deposition is likely to have occurred.

As above, the determination by the flowchart in FIG. 5 is terminated. This means that the presence/absence of lithium deposition is determined without assembling the batteries 51. Specifically, if all the following four conditions <1> to <4> are satisfied, it is determined that lithium deposition has occurred. If even one of the conditions is not satisfied, it is determined that lithium deposition has not occurred.

<1> "Symmetry" is present in the coefficient plot diagram (#1).
<2> "Symmetry" is lost without being maintained in the coefficient plot diagram (#2) or Intersection is present in the coefficient plot diagram (#3).
<3> Coefficients are distributed on both the positive and negative sides in the coefficient plot diagram (#4).
<4> Battery resistance largely increases before and after sampling (#5).

Second Embodiment

A configuration of a battery system in a second embodiment is identical to that in the first embodiment shown in FIG. 1, except that the second embodiment is directed to only a battery 51 using natural graphite as a negative electrode material. The second embodiment differs from the first embodiment in a method of determining lithium deposition. Specifically, since the kind of batteries to be determined is limited, the determination can be made by a simpler method.

In the second embodiment, only discharging voltage coefficient BDn is used as data for determination. In short, it is determined that no lithium deposition occurs as long as the discharging voltage coefficient BDn is positive and it is determined that lithium deposition has occurred when the discharging voltage coefficient BDn becomes negative. A calculating method of the discharging voltage coefficient BDn may be selected from either of the two methods explained in the first embodiment.

To confirm the effectiveness of this method, results of the test conducted by the present inventors are explained. In this test, a repetitive current is applied to target batteries 51 under the same conditions as those in "I. Data sampling" in the first embodiment. During this period, discharging voltage was measured and, based on the measured discharging voltage, a quadratic discharging voltage coefficient was calculated. The target batteries 51 used herein are batteries of the same type but in three different states.

TABLE 1

| | | Target Battery No. | | |
|---|---|---|---|---|
| | | 1 | 2 | 3 |
| Coefficient | T1 | 0.00000551 | 0.00001329 | 0.00001061 |
| | T2 | 0.00000289 | 0.00000160 | −0.00000064 |
| | T3 | 0.00000313 | 0.00000187 | −0.00000058 |
| | T4 | 0.00000267 | 0.00000081 | −0.00002664 |
| | T5 | 0.00000280 | −0.00000239 | −0.00019165 |
| Li Deposition | | Absent | Present | Present |
| Capacity Retaining Ratio | | 98% | 93% | 52% |

Table 1 shows the results. A section "Li Deposition" in Table 1 indicates the results obtained when the batteries were disassembled after the sampling period T5 and the presence/absence of lithium deposition was checked. A section "Capacity Retaining Ratio" indicates a ratio of the battery capacity after test with respect to the battery capacity before test.

Seeing Table 1, in the battery No. 1, the discharging voltage coefficients remained positive and lithium deposition were absent. The capacity retaining ratio thereof was close to 100%. In the battery No. 2, the discharging voltage coefficients were negative in the sampling period T5 and lithium deposition were present. The capacity retaining ratio thereof was slightly lower than that of No. 1. In the battery No. 3, the discharging voltage coefficients were negative in the earlier sampling period T2 and remained negative thereafter. Lithium deposition was present. The capacity retaining ratio thereof was remarkably low.

It is clear from the above results that whether or not there is a possibility of occurrence of lithium deposition can be determined based on the signs of coefficient without disassembling the battery 51. Specifically, if the coefficient remains positive, it can be determined that lithium deposition has not occurred in the battery 51. On the other hand, if the discharging voltage coefficient turns negative, it can be determined that lithium deposition is likely to have occurred. The method of determining lithium deposition in the second embodiment is as above.

Figure 12:
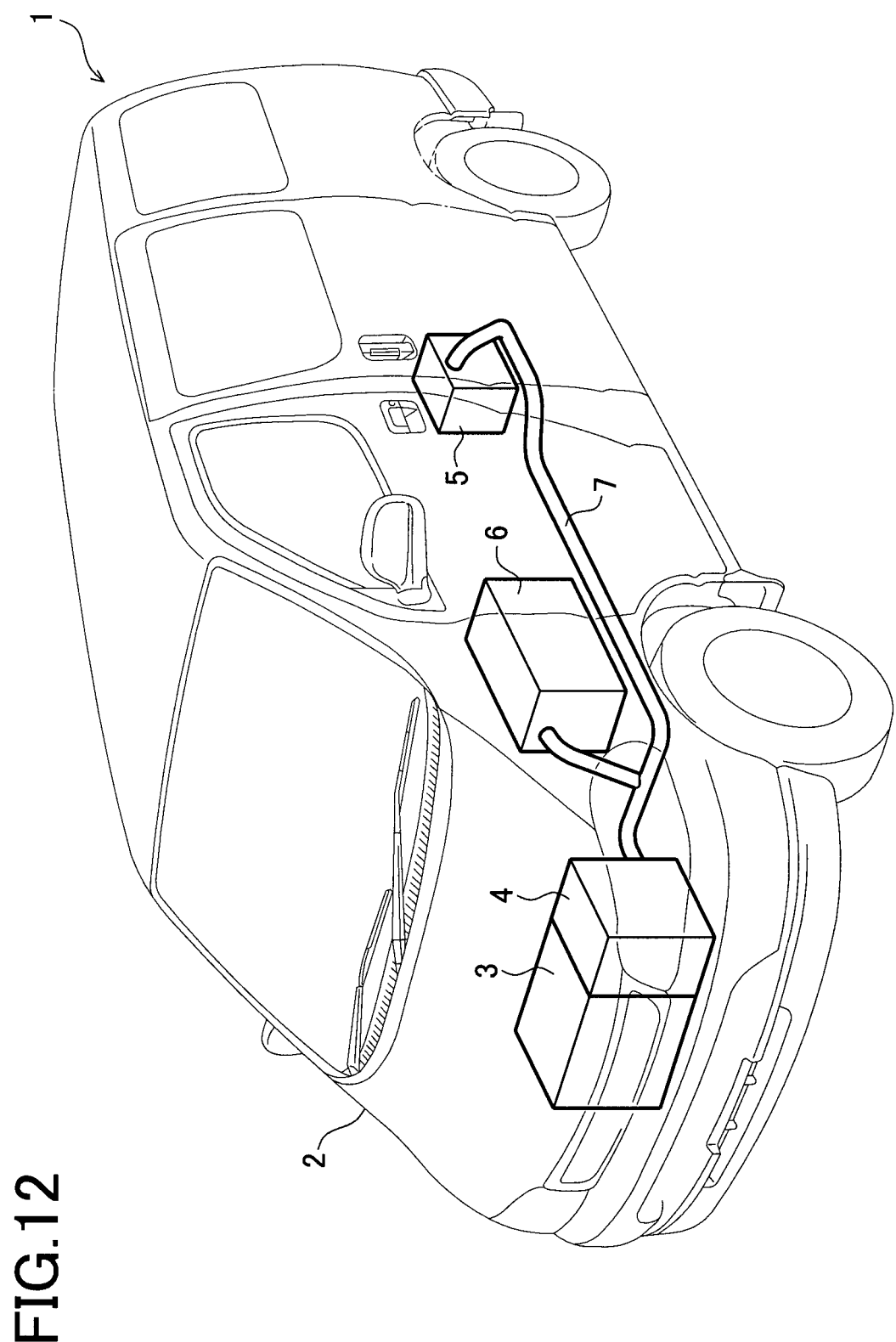
FIG. 12 is a perspective view showing a hybrid vehicle mounting a nonaqueous electrolyte type lithium ion secondary battery.

The battery system in the first or second embodiment can be mounted in a hybrid vehicle and others. FIG. 12 shows a hybrid vehicle 1 mounting the battery system in the present embodiments. In the hybrid vehicle 1 in FIG. 12, an engine 3, a motor 4, a battery pack 5, and a controller 6 are installed in a vehicle body 2. The battery pack 5, the motor 4, and the controller 6 are connected to each other via a cable 7.

The battery pack 5 contains a plurality of batteries. The batteries may be a flat type or a cylindrical type. The hybrid vehicle 1 is operated by the engine 3 in combination with the motor 4 to drive wheels. In the hybrid vehicle 1 in the present embodiments, a discharging current is supplied from the battery pack 5 to the motor 4, so that the motor 4 generates power. Further, depending on a running state of the vehicle 1, regenerative electromotive force may occur in the motor 4. This supplies a charging current to the batteries of the battery pack 5 to charge them. Herein, the controller 6 controls current of both directions between the battery pack 5 and the motor 4. The controller 6 therefore contains a known inverter.

The vehicle in the present embodiments is not limited to the hybrid vehicle and may be any vehicle using electric energy of the batteries as all or part of the power source. For instance, the vehicles may include an electric vehicle, a plug-in hybrid vehicle, a hybrid railroad vehicle, a forklift, an electric-driven wheel chair, an electric power assisted bicycle, an electric motor scooter, etc. In the hybrid vehicle 1, the battery pack 5, the motor 4, and the controller 6 constitute the battery system.

The controller 6 of the hybrid vehicle 1 has a function of monitoring discharging voltage and charging voltage in the batteries of the battery pack 5 in addition to standard running control. In other words, the battery voltage obtained when a power running state in which a discharging current is supplied from the battery pack 5 to the motor 4 is switched to a coasting state in which a charging current is supplied from the motor 4 to the battery pack 5 is discharging voltage.

To the contrary, the battery voltage obtained when the coasting state is switched to the power running state is charging voltage. The controller 6 obtains and records discharging voltage and charging voltage at any time during running. The controller 6 also measures and records resistance values of the batteries as needed. Furthermore, a resistance value of each battery in an original condition is also recorded.

In an actual vehicle, current values of the charging current and the discharging current are not constant. Also, a period of duration of one charging or discharging operation is not constant. A temperature is also not constant. The controller 6 thus obtains discharging voltage and charging voltage while making corrections depending on those factors in every measurement. A value after correction is recorded. In the actual vehicle, periodic readjustment of battery SOC is not conducted during running. Accordingly, a delimiting manner of sampling period is appropriately determined in advance based on running time and running distance or the number of measurements of charging voltage and discharging voltage, and others.

Based on each data of the above obtained charging voltage, discharging voltage, resistance in an original condition, and resistance after the start of use, the controller 6 makes determination of lithium deposition by the method explained in the first embodiment. As an alternative, if the batteries of the battery pack 5 use natural graphite as a negative electrode material, it can also be determined based on data of discharging voltage by the method in the second embodiment. In this case, it is not necessary to obtain data of charging voltage and resistance value. If it is determined that lithium deposition is present, a meter panel of the hybrid vehicle 1 displays a message that prompts replacement of the battery(s).

Another alternative is to only store data of discharging voltage and charging voltage or their quadratic coefficients in the controller 6. When the hybrid electric vehicle 1 is put in a maintenance factory, a computer of the maintenance factory and the controller 6 are connected to make the above determination on the factory's computer. Even such a method can inform a user or a mechanic of the necessity of replacement of battery(s).

According to the present embodiments explained in detail above, it is possible to accurately determine the possibility of occurrence of lithium deposition in the battery(s) without disassembling the battery(s). Thus, a determination result can be quickly fed back to development of batteries. When the present invention is applied to batteries mounted in a vehicle, it is possible to easily ascertain the battery(s) reaches replacement time.

The present invention may be embodied in other specific forms without departing from the essential characteristics thereof. For instance, the measurement conditions such as sampling intervals and current values to be applied for data sampling are arbitrarily selected. The present invention may also be applied to any equipment other than the vehicles if only it uses a battery.

REFERENCE SIGNS LIST

1 Hybrid vehicle
4 Motor
5 Battery pack
6 Controller
10 Nonaqueous electrolyte type lithium ion secondary battery system
11 Current applying part
12 Data obtaining part
13 Coefficient calculating part
14 Deposition determining part
51 Nonaqueous electrolyte type lithium ion secondary battery

The invention claimed is:

1. A nonaqueous electrolyte type lithium ion secondary battery system comprising:
    a voltage obtaining part for obtaining charging voltage when a charging current is applied to a nonaqueous electrolyte type lithium ion secondary battery and obtaining discharging voltage when a discharging current is generated by the nonaqueous electrolyte type lithium ion secondary battery;
    a coefficient calculating part for calculating a coefficient of a quadratic term of an approximated curve of a quadratic function with respect to changes in value within a previously set sampling period for each of the charging voltage and the discharging voltage obtained by the voltage obtaining part, and repeating the calculation over a plurality of the sampling periods; and
    a deposition determining part for determining whether or not there is a possibility of lithium deposition in the nonaqueous electrolyte type lithium ion secondary battery based on a tendency of changing with time of the coefficients of charging voltage and discharging voltage calculated by the coefficient calculating part.

2. The nonaqueous electrolyte type lithium ion secondary battery system according to claim 1, wherein
    the deposition determining part is arranged to determine that:
    there is no possibility of lithium deposition when the occurrence frequency of symmetry phenomenon in which an increasing and decreasing tendency of a newly calculated coefficient with respect to a previously calculated coefficient is reversed between a charging side and a discharging side is less than a previously set threshold frequency, and
    there is a possibility of lithium deposition when the occurrence frequency of symmetry phenomenon is as high as the threshold frequency or more.

3. The nonaqueous electrolyte type lithium ion secondary battery system according to claim 2, further comprising:
    a power source part constituted of the nonaqueous electrolyte type lithium ion secondary battery or a plurality of the batteries; and
    a loading part for generating driving force in response to a discharging current from the power supply part and supplying a charging current resulting from energy regeneration to the power supply part,
    the voltage obtaining part being arranged to obtain charging voltage and discharging voltage of the nonaqueous electrolyte type lithium ion secondary battery of the power supply part.

4. The nonaqueous electrolyte type lithium ion secondary battery system according to claim 2, wherein
even when the occurrence frequency of symmetry phenomenon is as high as the threshold frequency or more, the deposition determining part determines that:
there is no lithium deposition when no intersection phenomenon has occurred in which a magnitude relation of the coefficient of charging voltage and the coefficient of discharging voltage is reversed and there is no decrease with a differential larger than a previously set threshold differential after the occurrence frequency of symmetry phenomenon is determined to be as high as the threshold frequency or more, and
there is a possibility of lithium deposition when the intersection phenomenon has occurred or the occurrence frequency of symmetry phenomenon decreases with the differential larger than the threshold differential.

5. The nonaqueous electrolyte type lithium ion secondary battery system according to claim 4, further comprising:
a power source part constituted of the nonaqueous electrolyte type lithium ion secondary battery or a plurality of the batteries; and
a loading part for generating driving force in response to a discharging current from the power supply part and supplying a charging current resulting from energy regeneration to the power supply part,
the voltage obtaining part being arranged to obtain charging voltage and discharging voltage of the nonaqueous electrolyte type lithium ion secondary battery of the power supply part.

6. The nonaqueous electrolyte type lithium ion secondary battery system according to claim 4, wherein
even when the intersection phenomenon has occurred or the occurrence frequency of symmetry phenomenon decreases with the differential larger than the threshold differential,
the deposition determining part determines that:
there is no possibility of lithium deposition when a ratio of positive coefficients in the coefficients of charging voltage and discharging voltage calculated by the coefficient calculating part is as high as a previously threshold ratio or higher, and
there is a possibility of lithium deposition when the ratio is less than the threshold ratio.

7. The nonaqueous electrolyte type lithium ion secondary battery system according to claim 6, further comprising:
a power source part constituted of the nonaqueous electrolyte type lithium ion secondary battery or a plurality of the batteries; and
a loading part for generating driving force in response to a discharging current from the power supply part and supplying a charging current resulting from energy regeneration to the power supply part,
the voltage obtaining part being arranged to obtain charging voltage and discharging voltage of the nonaqueous electrolyte type lithium ion secondary battery of the power supply part.

8. The nonaqueous electrolyte type lithium ion secondary battery system according to claim 6, wherein
even when the ratio is less than the threshold ratio,
the deposition determining part determines that:
there is no possibility of lithium deposition when an increasing rate of resistance of the nonaqueous electrolyte type lithium ion secondary battery subject to determination before and after obtaining the charging voltage and discharging voltage by the voltage obtaining part for repeating calculation of the coefficient by the coefficient calculating part is less than a previously set threshold increasing rate, and
there is a possibility of lithium deposition when the increasing rate of resistance in the nonaqueous electrolyte type lithium ion secondary battery is as high as the threshold increasing rate or higher.

9. The nonaqueous electrolyte type lithium ion secondary battery system according to claim 8, further comprising:
a power source part constituted of the nonaqueous electrolyte type lithium ion secondary battery or a plurality of the batteries; and
a loading part for generating driving force in response to a discharging current from the power supply part and supplying a charging current resulting from energy regeneration to the power supply part,
the voltage obtaining part being arranged to obtain charging voltage and discharging voltage of the nonaqueous electrolyte type lithium ion secondary battery of the power supply part.

10. The nonaqueous electrolyte type lithium ion secondary battery system according to claim 1, further comprising:
a power source part constituted of the nonaqueous electrolyte type lithium ion secondary battery or a plurality of the batteries; and
a loading part for generating driving force in response to a discharging current from the power supply part and supplying a charging current resulting from energy regeneration to the power supply part,
the voltage obtaining part being arranged to obtain charging voltage and discharging voltage of the nonaqueous electrolyte type lithium ion secondary battery of the power supply part.

11. A vehicle including a nonaqueous electrolyte type lithium ion secondary battery system set forth in claim 10, wherein the loading part is a motor for driving to rotate wheels.

12. A nonaqueous electrolyte type lithium ion secondary battery system comprising:
a voltage obtaining part for obtaining discharging voltage when a discharging current is generated by a nonaqueous electrolyte type lithium ion secondary battery using natural graphite as a negative electrode material;
a coefficient calculating part for calculating a coefficient of a quadratic term of an approximated curve of a quadratic function with respect to changes in value within a previously set sampling period for the discharging voltage obtained by the voltage obtaining part; and
a deposition determining part for determining that there is no possibility of lithium deposition in the nonaqueous electrolyte type lithium ion secondary battery if the coefficient of discharging voltage calculated by the coefficient calculating part is positive and that there is a possibility of lithium deposition if the coefficient is negative.

13. The nonaqueous electrolyte type lithium ion secondary battery system according to claim 12, comprising:
a power supply part constituted of the nonaqueous electrolyte type lithium ion secondary battery using natural graphite as the negative electrode material or a plurality of the batteries; and
a loading part for generating driving force in response to a discharging current from the power supply part and supplying a charging current resulting from energy regeneration to the power supply part, the voltage obtaining part obtains discharging voltage of the nonaqueous electrolyte type lithium ion secondary battery of the power supply part.

14. A method of determining lithium deposition in a nonaqueous electrolyte type lithium ion secondary battery, the method comprising:

obtaining, via a voltage obtaining part, charging voltage when a charging current is applied to a nonaqueous electrolyte type lithium ion secondary battery and obtaining, via the voltage obtaining part, discharging voltage when a discharging current is generated by the nonaqueous electrolyte type lithium ion secondary battery;

calculating, via a coefficient calculating part, a coefficient of a quadratic term of an approximated curve of a quadratic function with respect to changes in value within a previously set sampling period for each of the obtained charging voltage and discharging voltage, and repeating the calculation, via the coefficient calculating part, over a plurality of the sampling periods; and determining whether or not there is a possibility of lithium deposition in the nonaqueous electrolyte type lithium ion secondary battery based on a tendency of changing with time of the calculated coefficients on a charging side and a discharging side.

15. A method of determining lithium deposition in a nonaqueous electrolyte type lithium ion secondary battery, the method comprising:

obtaining, via a voltage obtaining part, discharging voltage when a discharging current is generated by a nonaqueous electrolyte type lithium ion secondary battery;

calculating, via a coefficient calculating part, a coefficient of a quadratic term of an approximated curve of a quadratic function with respect to changes in value within a previously set sampling period for the obtained discharging voltage; and determining that there is no possibility of lithium deposition in the nonaqueous electrolyte type lithium ion secondary battery if the calculated coefficient of discharging voltage is positive and that there is a possibility of lithium deposition if the coefficient is negative.

* * * * *